United States Patent
Trott

(10) Patent No.: US 7,796,684 B2
(45) Date of Patent: Sep. 14, 2010

(54) RF TRANSCEIVER ADAPTED FOR SIGNAL ISOLATORS AND PROXIMITY SENSORS

(75) Inventor: Gary R. Trott, San Mateo, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 623 days.

(21) Appl. No.: 11/678,708

(22) Filed: Feb. 26, 2007

(65) Prior Publication Data

US 2008/0205495 A1    Aug. 28, 2008

(51) Int. Cl.
*H04B 1/38* (2006.01)
*H04L 5/16* (2006.01)

(52) U.S. Cl. ...................................... 375/219
(58) Field of Classification Search ................... 375/219
See application file for complete search history.

(56) References Cited

U.S. PATENT DOCUMENTS

| | | | | |
|---|---|---|---|---|
| 5,896,104 A * | 4/1999 | Komatsu et al. | ............ | 342/175 |
| 7,295,161 B2 * | 11/2007 | Gaucher et al. | ....... | 343/700 MS |
| 2007/0222697 A1 * | 9/2007 | Caimi et al. | ................ | 343/861 |
| 2008/0158084 A1 * | 7/2008 | Rofougaran | ................ | 343/793 |

* cited by examiner

*Primary Examiner*—Curtis B Odom

(57) ABSTRACT

A transceiver having a transmitting antenna, a receiving antenna, and a substrate having transmitter and receiver dies is disclosed. The transmitter generates an RF signal having a carrier frequency and the receiver detects and amplifies signals of the carrier frequency. The transmitting antenna and/or the receiving antenna includes a first wire antenna loop having a length greater than or equal to one tenth of a wavelength of the carrier frequency. The first wire antenna loop is connected to the transmitter die by a wire bond on a bond pad of the transmitter die. The antenna loop or loops can be encapsulated in an insulating material to protect the loops and fix the loops in space. The transceiver can be configured to operate as a galvanic isolator or a proximity detector.

15 Claims, 5 Drawing Sheets

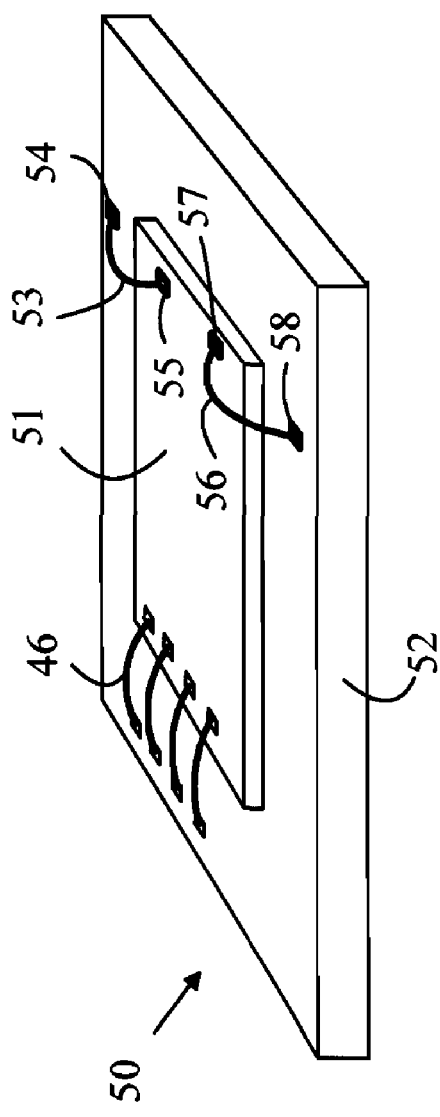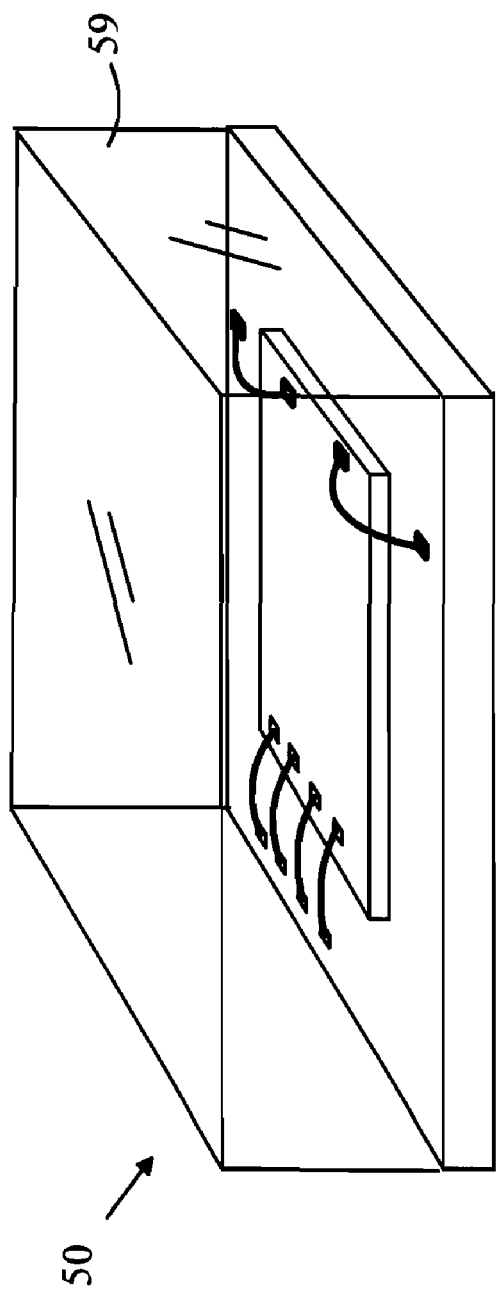

RF TRANSCEIVER ADAPTED FOR SIGNAL ISOLATORS AND PROXIMITY SENSORS

BACKGROUND OF THE INVENTION

Transceivers are utilized in a number of systems to transmit and receive data and to implement proximity detectors and galvonic isolators. Transceivers utilize a transmitter to send data on a carrier and a receiver to detect the modulated carrier and extract data from that signal. Transceivers based on optical and RF carriers are known to the art.

In a proximity detector, the signal from the transmitter is reflected from an object, and, when the object is within range, the reflected signal is detected by the receiver. The fraction of the transmitted energy that reaches the receiver is usually quite small, and hence, such devices require a significant amount of power and high amplification levels at the receiver.

Galvonic isolators provide a means for moving logic signals between two circuits that must otherwise be electrically isolated from one another. For example, the transmitting circuit could utilize high internal voltages that would present a hazard to the receiving circuit or individuals in contact with that circuit. In the more general case, the isolating circuit must provide both voltage and noise isolation across an insulating barrier. Once again, the fraction of the signal energy that is recovered by the receiver tends to be quite small.

Transceivers that utilize optical and RF carriers are known to the art. An optical transceiver typically includes a light source, such as a light emitting diode (LED) that is used to transmit data by modulating the intensity of the light source and a photodiode that receives the modulated light signals. Optical transceivers operating in the infrared are utilized in computers and handheld devices for transferring data from one device to another without requiring that the devices be connected together by a wire or cable. In such systems, the two devices are positioned relative to one another such that light from the transmitter in the first device is received by the optical receiver in the second device, and vice versa.

Optical transceivers are energy inefficient for two reasons. First, the fraction of the electrical energy that is converted to light is relatively small. Second, the fraction of the light energy that is converted back to electrical energy is also small. Hence, significant amounts of power must be provided at both the transmitter and receiver.

RF transceivers utilize RF signals as the carrier. The transmitter includes a circuit that modulates the carrier and launches the modulated carrier with the aid of an antenna at the transmitter. Similarly, an antenna at the receiver converts the energy in the radio waves to an electrical signal in a conductor that is connected to a receiver that amplifies the signal and recovers the modulation data.

RF transceivers typically operate in the far field. That is, the two antennae are separated by a distance that is greater than a few wavelengths of the RF carrier signal. In this case, the RF transceiver behaves in a manner analogous to that of an optical transceiver. That is, the energy efficiency of the device is small.

In addition, RF transceivers typically operate at frequencies that require relatively large antennae. The efficiency with which the electrical signals from the transmitter are converted to the RF field that couples the transmitter and receiver decreases markedly as the size of the antennae is reduced to lengths that are less than one quarter the wavelength of the carrier signal. Similarly, the fraction of the transmitted energy that is converted to electrical signals in the receiving antenna also decreases markedly as the size of the receiving antenna is reduced to lengths that are less than one quarter the wavelength of the carrier signal. Hence, RF transceivers have not been able to compete with optical transceivers in consumer applications requiring small transceivers and limited power consumption.

Finally, RF transceivers require separate antenna structures that are not part of the integrated circuit in which the transceiver and receiver are fabricated. The need for the separate antennae increases the cost of the transceiver, and hence, further limits the applications that can utilize RF transceivers.

SUMMARY OF THE INVENTION

The present invention includes a transceiver having a transmitting antenna, a receiving antenna, and a substrate having transmitter and receiver dies. The transmitter generates an RF signal having a carrier frequency and the receiver detects and amplifies signals of the carrier frequency. The transmitting antenna and/or the receiving antenna includes a first wire antenna loop having a length greater than or equal to one tenth of a wavelength of the carrier frequency. The first wire antenna loop is connected to the transmitter die by a wire bond on a bond pad of the transmitter die. In one aspect of the invention, a layer of insulating material encapsulates the first wire antenna loop. In another aspect of the invention, the transmitting antenna and the receiving antenna are separated by a distance of less than 2 wavelengths of the carrier frequency. In yet another aspect of the invention, the transmitting antenna and the receiving antenna are oriented such that signals from the transmitting antenna are received by the receiving antenna when the signals are reflected from an external object at a predetermined position with respect to the transceiver, and signals from the transmitting antenna that are not reflected from the external object are prevented from being received by the receiving antenna.

BRIEF DESCRIPTION OF THE DRAWINGS

FIG. 4 is a perspective view of a transceiver component according to another embodiment of the present invention.

FIG. 5 is a perspective view of component 50 discussed above with reference to FIG. 4 after component 50 has been encapsulated in an insulating layer.

DETAILED DESCRIPTION OF THE PREFERRED EMBODIMENTS OF THE INVENTION

The present invention is based on the observation that at frequencies in 100 GHz range, a RF transceiver that operates in the near field can be constructed on a substrate that is small enough to be useful in many handheld devices and that has an electrical efficiency that exceeds that of optical transceivers.

The manner in which the present invention provides its advantages can be more easily understood with reference to an RF transceiver that is configured to provide a galvanic isolator. A galvanic isolator can be viewed as a split circuit element in which the first portion of the circuit element is the transmitter and the second portion is the receiver of the transceiver. The two portions are disposed on a substrate and connected to separate power supplies having grounds and power rails that are not connected to one another in a manner that prevents interference in one portion of the isolator to propagate to the other portion of the isolator. In the case of an RF transceiver, the transmitting antenna is in the first portion of the circuit, and the receiving antenna is in the second portion of the circuit.

Figure 1:
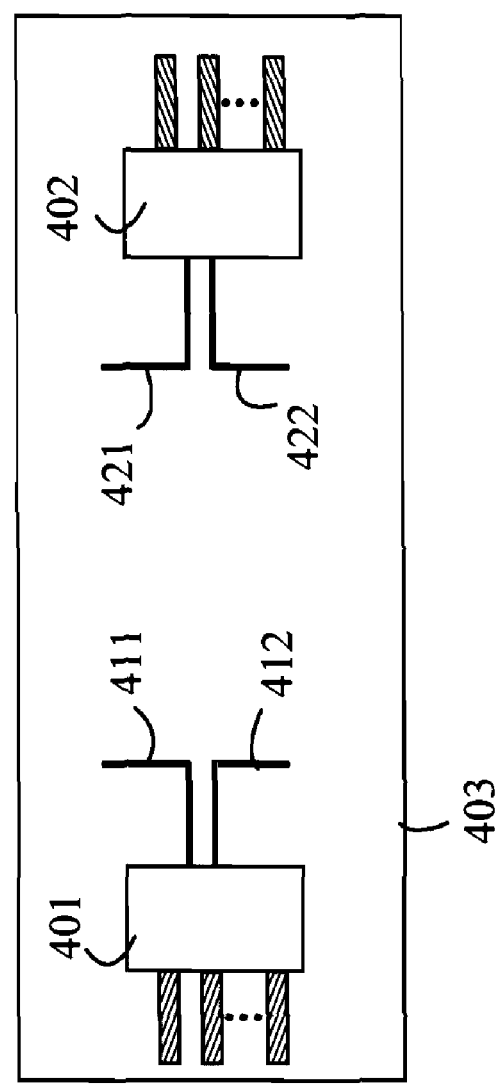
FIG. 1 illustrates one embodiment of a galvanic isolator constructed from a transceiver according to the present invention.

Refer now to FIG. 1, which illustrates one embodiment of a galvanic isolator constructed from a transceiver according to the present invention. Galvanic isolator 400 utilizes a pair of antennae disposed on a polymeric or other insulating substrate 403. A transmitting chip 401 drives a transmitting antenna having branches shown at 411 and 412. A receiving chip 402 picks up the signals received on a receiving antenna having branches shown at 421 and 422. The receiving antenna and transmitting antenna are separated by a gap. It should be noted that branches 411, 412, 421, and 422 can be traces on substrate 403, or, as will be explained in more detail below, the antenna can be constructed from wires that extend outward from transmitter 401 or receiver 402. The antennae may touch substrate 403, be bonded to substrate 403 or encapsulated in substrate 403. Such wire can be wire bonded to pads connected to traces on substrate 403.

At an RF carrier frequency of 100 GHz, the wavelength of the carrier is approximately 3 mm. Hence, the antennae do not significantly increase the size of the galvanic isolator at frequencies that are greater than 100 GHz, since the transmitting and receiving chips are of this size or larger. Hence, a transceiver having antennae that efficiently launch and pickup the carrier signal can be constructed.

In addition, the antennae can be placed within one wavelength of one another on the substrate. In this case, the transceiver operates in the near field mode. In the near field, the coupling between the antennae is substantially increased over that obtained when the antennae are operating in the far field. Hence, the power requirements are reduced still further.

In one embodiment, the antennae are constructed from wire loops that are formed by wire bonds driven by pads on the transmitter, and optionally, between pads on the substrate. Wire bonds are often used to connect the various dies to traces on the substrate; hence, the additional wire bonds represent an insignificant increase in the cost of fabricating the transducer. In addition, the length of each antenna can be significantly longer than the distance between the pads on which the wire bond terminates, since the wire loop extends above the substrate. Hence, the space on the substrate or transmitter needed to implement the antenna is further reduced.

Figure 2:
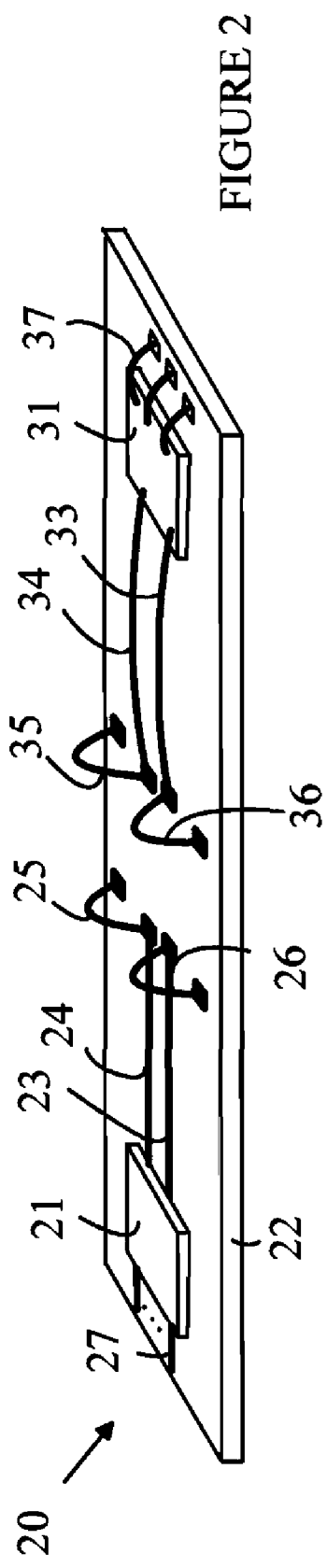
FIG. 2 is a perspective view of another embodiment of a galvanic isolator according to the present invention.

Refer now to FIG. 2, which is a perspective view of another embodiment of a galvanic isolator according to the present invention. Galvanic isolator 20 includes a die 21 having a transmitter and a die 31 having a receiver. The dies are mounted on an insulating substrate 22. The substrate could be a printed circuit board that includes a number of traces that are used to make connections to the components on the substrate. Such traces are shown at 23 and 24. Alternatively, all of the traces could be made by wire bonds such as the connections shown at 33 and 34. Each of dies is connected to connectors on the bottom side of substrate 22 by additional connections that could either be traces as shown at 27 or wire bonds as shown at 37.

The transmit and receive antennae shown in FIG. 1 are dipole antennae constructed from wire segments that are formed by wire bonding to pads on substrate 22. The transmit antenna is formed from segments 25 and 26, and the receive antenna is formed from segments 35 and 36. In this embodiment, the distance between the antennae is less than three wavelengths of the carrier frequency used by the transmitter and receiver, and preferably less than one wavelength of the carrier frequency. As will be explained in more detail below, other antenna configurations could also be utilized.

Figure 3:
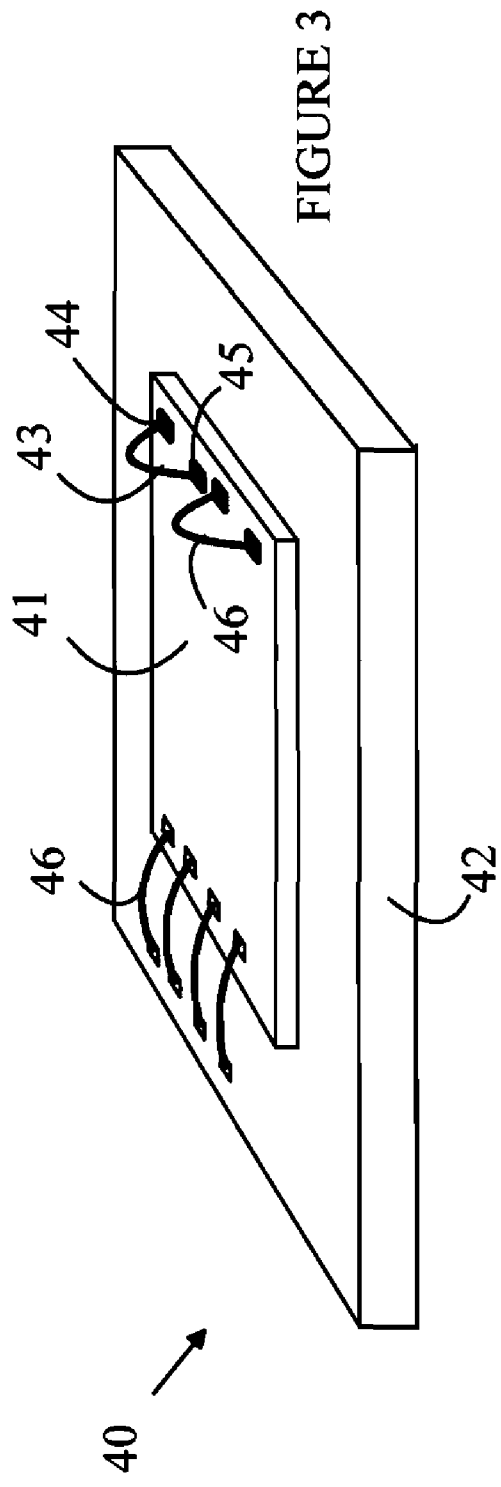
FIG. 3 is a perspective view of a transceiver component 40 according to one embodiment of the present invention.

In the embodiment shown in FIG. 2, the antenna segments are constructed on the substrate. However, if the dies are sufficiently large, the antenna segment could be formed between pads on the dies. Refer now to FIG. 3, which is a perspective view of a transceiver component 40 according to one embodiment of the present invention. Component 40 could be either a transmitter or a receiver. Component 40 includes a die 41 having the transmitter or receiver fabricated thereon. Die 41 is mounted on a substrate 42 that includes a number of external connection pads on the bottom surface thereof that are connected to die 41 by wire bonds 46. The external connections are not shown in the drawing but are conventional in design and could include pins for mounting on printed circuit boards or surface mounting pads. Substrate 42 could be a printed circuit board or a lead frame-based substrate.

Die 41 also includes wire bond pads such as pads 44 and 45. Antenna loops such as loops 43 and 46 are formed by attaching a loop of wire between these pads using conventional wire bonding. Since the length of wire loops 43 and 46 can be significantly longer than the spacing between the bond pads, the minimum die size can be smaller than the wavelength of the carrier frequency utilized by the transceiver.

While the embodiment shown in FIG. 3 is a single transceiver component, a complete transceiver in which the both the transmit and receive antennae are constructed on the dies having the respective transmitter and receiver circuits could also be constructed in an analogous manner. In such an embodiment, a common substrate could be utilized for mounting both the transmit and receiving dies in a manner analogous to that discussed above with reference to FIG. 2.

The above described embodiments utilize an arrangement in which the antennae are constructed by wire segments that are bonded between pads that are either part of the die or part of the substrate on which the die is mounted. However, embodiments in which one or both of the loops are formed by a wire that is bonded to a first pad on the substrate and a second pad on the die could also be constructed. Refer now to FIG. 4, which is a perspective view of a transceiver component according to another embodiment of the present invention. Component 50 is similar to component 40 discussed above in that it includes a die 51 that has a transmitter or a receiver constructed thereon. Die 51 is connected to pads on substrate 52 by wire bonds 46. The antenna loops 53 and 56 utilized by component 50 are formed by wire loops that are bonded between two wire bond pads. For each of the loops, one of the wire bond pads is located on die 51 and one of the wire bond pads is located on substrate 52. The pads utilized by loop 53 are shown at 54 and 55, and the pads utilized by loop 56 are shown at 57 and 58.

In practice, the wire loops used for the antennae and the various die-to-substrate connections are encapsulated in an insulating layer to protect the wire loops and to fix the wire loop configurations in space. Refer now to FIG. 5, which is a perspective view of component 50 discussed above with reference to FIG. 4 after component 50 has been encapsulated in an insulating layer 59. The insulating layer can be constructed from any suitable insulating material. The insulating material preferably has a thermal coefficient of expansion that is similar to that of the substrate on which the die or dies are mounted. The insulating material could also be a flexible material such as silicone to prevent damage to the wire loops in the event the component is subjected to a significant change of temperature.

Figure 6:
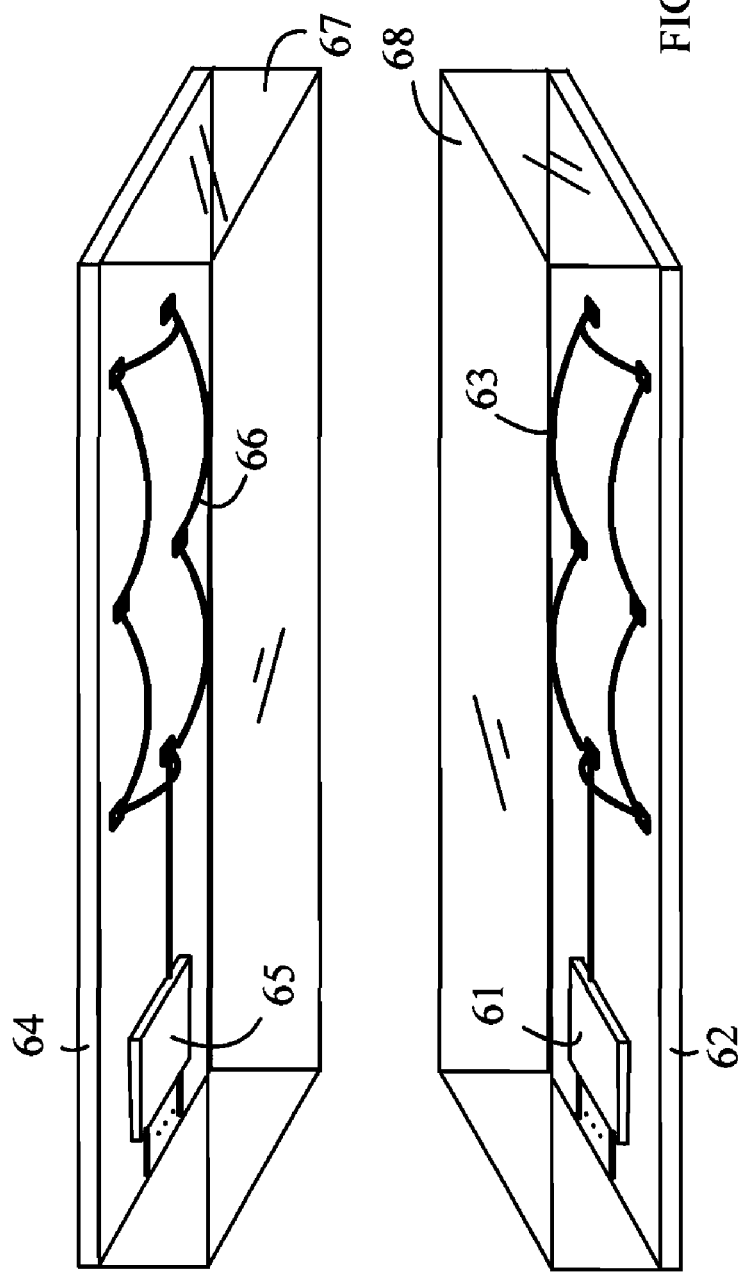
FIG. 6 illustrates a transceiver in which the antennae are in the form of horizontal loops.

The above-described embodiments of the present invention utilize dipole configured antennae in which the wire loops are in a vertical configuration relative to the underlying substrate on which the wire bond pads are located. However, other antenna configurations could also be constructed using the present invention. In addition, embodiments in which the plane of the loops are in a horizontal configuration could also be constructed. Refer now to FIG. 6, which illustrates a transceiver in which the antennae are in the form of horizontal loops. Transceiver 60 is constructed from a transmitter component 67 and receiver component 68. Transmitter component 67 includes a die 65 having an RF transmitter circuit and a transmit antenna 66 consisting of a horizontal loop antenna that is constructed from a number of wire segments forming an antenna loop that are wire bonded to pads on a substrate 64. Similarly, receiver component 68 is constructed from a die 61 having an RF receiver circuit and a receiver antenna 63 that is constructed from a number of wire segments forming an antenna loop that are wire bonded to pads on a substrate 62. Each of the components is encapsulated in an insulating layer in a manner analogous to that described above. In practice, the two components would be bonded together to form the final transceiver if the transceiver was to be utilized as a galvanic isolator. However, to simplify the drawing, the components have been shown separated from one another. If the two components are to be used in a data transmission link between first and second devices, one of the components would be attached to the first device and the other would be attached to the second device, and the components would be separated from one another.

Figure 7:
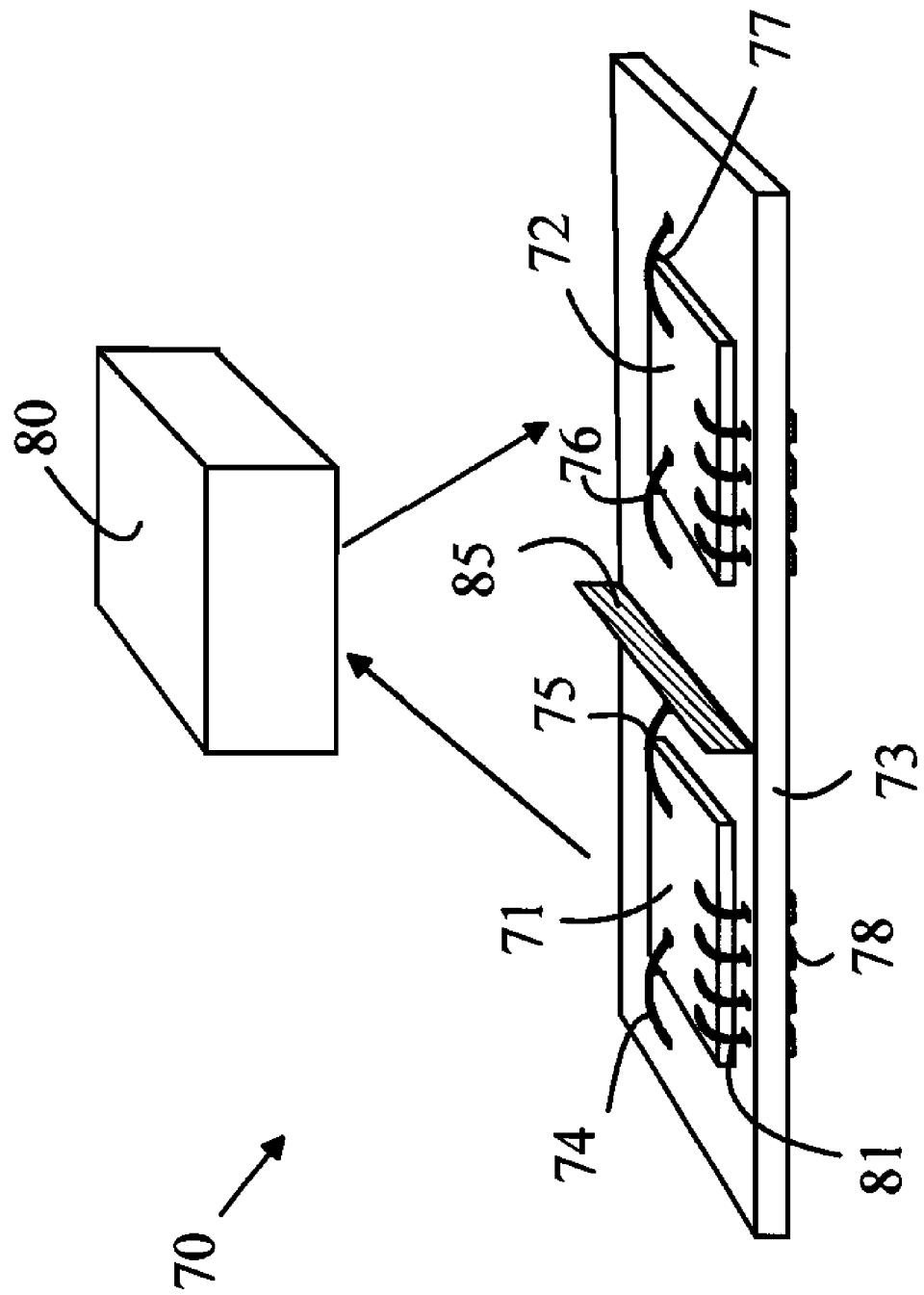
FIG. 7 illustrates one embodiment of a proximity sensor according to the present invention.

A transceiver according to the present invention can also be configured as a proximity sensor. Refer now to FIG. 7, which illustrates one embodiment of a proximity sensor according to the present invention. Proximity sensor 70 is constructed from a transmitter circuit die 71 and a receiver circuit die 72. The transmitter in die 71 drives an appropriate antenna that includes wire loops 74 and 75 that are wire bonded to pads on die 71 and substrate 73. Similarly, the receiver in die 72 receives signals from a similar antenna that includes wire loops 76 and 77 that are wire bonded to pads on die 72 and substrate 73. The signals and power connections for proximity sensor 70 are provided through connectors on the bottom surface of substrate 73 that are connected to the various dies by wire bonded loops. A typical connector and wire bonded loop are shown at 78 and 81, respectively. The antennae are sized to be optimal for the frequency utilized by die 71. The antennae are oriented such that an object 80 within the desired range of proximity sensor 70 reflects a portion of the outgoing signal from die 71 into the antenna connected to die 72. A shield 85 that includes a conducting barrier is used to prevent the transmitted signal from directly reaching the receiver antenna.

The above-described embodiments of the present invention utilize conventional wire bonding methods for connecting the ends of the antenna loops to pads on the dies or substrate. The wires utilized in such connections are typically made of aluminum or gold and have diameters between 1 and 15 mils and preferably between 1.25 and 1.50 mils. The bonds are typically formed by thermal compression bonding or ultrasonic welding; however, other methods of bonding including soldering or electrically conducting adhesives could be utilized.

While the above-described embodiments of the present invention have utilized specific antenna configurations, other configurations could also be utilized. The specific choice of antenna will, in general, depend on the intended use for the transceiver.

Various modifications to the present invention will become apparent to those skilled in the art from the foregoing description and accompanying drawings. Accordingly, the present invention is to be limited solely by the scope of the following claims.

What is claimed is:

1. A transceiver, comprising:
a radio-frequency transmitter assembly, comprising:
a first substrate;
a first die comprising a radio-frequency transmitter circuit, the first die mounted on a major surface of the first substrate;
a first antenna connected to the radio-frequency transmitter circuit, the first antenna comprising at least one wire segment with segment ends attached to respective bonding pads located on the major surface of the first substrate; and
a first power supply circuit configured to provide power to the radio-frequency transmitter circuit; and
a radio-frequency receiver assembly, comprising:
a second substrate;
a second die comprising a radio-frequency receiver circuit, the second die mounted on a major surface of the second substrate;
a second antenna connected to the radio-frequency receiver circuit, the second antenna comprising at least one wire segment with segment ends attached to respective bonding pads located on the major surface of the second substrate; and
a second power supply circuit configured to provide power to the radio-frequency receiver circuit;
wherein the radio-frequency transmitter assembly and the radio-frequency receiver assembly are attached to each other such that the major surface of the first substrate faces the major surface of the second substrate with an insulating barrier located in between, the insulating barrier arranged to provide voltage and noise isolation between the radio-frequency transmitter and receiver circuits, while accommodating radio-frequency coupling between the first and second antennae.

2. The transceiver of claim 1, wherein said transmitter circuit is configured for generating a signal having a carrier frequency and said receiver circuit is configured for detecting and amplifying signals of said carrier frequency, and wherein said first antenna and said second antenna each has a length substantially equal to one tenth of a wavelength of said carrier frequency.

3. The transceiver of claim 2 wherein said first antenna and said second antenna are separated by a distance less than 3 wavelengths of said carrier frequency.

4. The transceiver of claim 1 wherein said first and second antennae each comprises a first end that is wire bonded to a conductor on said first and second substrates respectively.

5. The transceiver of claim 1 wherein said first and second antennae each comprises a second end that is wire bonded to a conductor on said first and second dies respectively.

6. The transceiver of claim 1 wherein said first and second antennae each comprises a second end that is wire bonded to a conductor on said first and second substrates respectively.

7. The transceiver of claim 1 wherein said first and second antennae comprise dipoles.

8. The transceiver of claim 1 wherein said first and second antennae each comprises a closed loop having a plane parallel to a surface of said first and second substrates respectively.

9. The transceiver of claim 1, further comprising:
a first insulating layer that encapsulates the first die, the first antenna, the major surface of the first substrate, and at least a portion of the first power supply circuit; and
a second insulating layer that encapsulates the second die, the second antenna, the major surface of the second substrate, and at least a portion of the second power supply circuit;
and wherein the insulating barrier incorporates a bond between an external surface of the first insulating layer and an external surface of the second insulating layer.

10. The transceiver of claim 1 wherein the transceiver forms a part of a galvanic isolator.

11. A transceiver, comprising:
a radio-frequency transmitter comprising:
 a first substrate;
 a first die comprising a radio-frequency transmitter circuit, the first die mounted on a major surface of the first substrate;
 a first antenna connected to the radio-frequency transmitter circuit, the first antenna comprising at least one wire segment with segment ends attached to respective bonding pads located on the major surface of the first substrate, the first antenna operable to emit a radio-frequency signal in an upwards direction with reference to a top surface of the first substrate; and
 a first connector for providing connections to the radio-frequency transmitter, the first connector located on a bottom surface of the first substrate and facing away from the direction of emission of the radio-frequency signal;
a radio-frequency receiver, comprising:
 a second substrate;
 a second die comprising a radio-frequency receiver circuit, the second die mounted on a major surface of the second substrate;
 a second connector for providing connections to the radio-frequency receiver, the second connector located on the bottom surface of the second substrate; and
 a second antenna connected to the radio-frequency receiver circuit, the second antenna comprising at least one wire segment with segment ends attached to respective bonding pads located on the major surface of the second substrate;
a shield located between said radio-frequency transmitter and receiver, said shield arranged to prevent a signal that is emitted by said first antenna from being directly received in said second antenna, while permitting said signal to be received in said second antenna after reflection from an object located external to the transceiver; and
an insulating layer located between the radio-frequency transmitter and the radio-frequency receiver to provide voltage and noise isolation between the radio-frequency transmitter and receiver circuits, and
wherein the first and the second antennae are oriented such that said signal is reflected by said object only when said object is located within a desired range for proximity detection.

12. The transceiver of claim 11 wherein the substrate is part of a printed circuit board.

13. The transceiver of claim 11 wherein said first and second antennae each comprises a first end that is wire bonded to a conductor on said substrate.

14. A method of operating a radio-frequency transceiver assembly, the method comprising:
transmitting a ranging signal from a radio-frequency transmitter circuit that is co-located with a radio-frequency receiver circuit on a major surface of a substrate of the radio-frequency transceiver assembly, the ranging signal selected to have a signal strength adapted for proximity detection;
providing an insulating layer between the radio-frequency transmitter and receiver circuits for voltage and noise insulation;
providing power and signal connections to said radio-frequency transmitter circuit through a first connector located on an opposing major surface of the substrate;
providing power and signal connections to said radio-frequency receiver circuit through a second connector located on said opposing major surface of the substrate;
preventing said ranging signal from being directly received in said receiver circuit, while permitting said ranging signal to be received in said receiver circuit after reflection from an object located external to the radio-frequency transceiver assembly; and
using said ranging signal received in said radio-frequency receiver circuit to detect proximity of said object to said radio-frequency transceiver assembly.

15. The method of claim 14, wherein preventing said ranging signal from being directly received in receiver circuit comprises placing a shield between radio-frequency transmitter circuit and radio-frequency receiver circuit.

* * * * *